United States Patent
Yu

(10) Patent No.: US 8,014,135 B2
(45) Date of Patent: Sep. 6, 2011

(54) OPENING MECHANISM WITH AN EASY ASSEMBLY STRUCTURE AND RELATED ELECTRONIC DEVICE

(75) Inventor: Liang Yu, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 0 days.

(21) Appl. No.: 12/650,556

(22) Filed: Dec. 31, 2009

(65) Prior Publication Data

US 2010/0265666 A1 Oct. 21, 2010

(30) Foreign Application Priority Data

Apr. 15, 2009 (TW) ................................ 98206212 U

(51) Int. Cl.
H05K 5/00 (2006.01)
H05K 7/00 (2006.01)
H05K 7/02 (2006.01)
H01M 2/10 (2006.01)
E05C 5/00 (2006.01)
E05C 1/12 (2006.01)
A47B 81/00 (2006.01)

(52) U.S. Cl. ......... 361/679.01; 361/679.02; 361/679.03; 361/679.4; 361/679.41; 361/679.42; 361/679.43; 361/679.44; 361/807; 361/808; 361/809; 361/810; 429/97; 429/98; 429/100; 292/64; 292/164; 292/163; 312/223.1; 312/223.2; 312/223.3

(58) Field of Classification Search ............. 361/679.08, 361/679.09, 679.3, 679.55–679.59, 679.01–679.03, 361/679.4, 679.41–679.45, 807–812; 345/156, 345/157, 168, 169, 184; 455/325, 556.1, 455/550.1, 90.1, 575.1; 200/329; 174/535; 29/557; 429/94, 95, 96, 97, 98, 99, 100
See application file for complete search history.

(56) References Cited

U.S. PATENT DOCUMENTS

2007/0026297 A1* 2/2007 Qin et al. .................... 429/97
2007/0296225 A1* 12/2007 Ashton et al. ............... 292/163
2009/0320628 A1* 12/2009 Huang et al. ................. 429/97

* cited by examiner

Primary Examiner — Jayprakash N Gandhi
Assistant Examiner — Jerry Wu
(74) Attorney, Agent, or Firm — Winston Hsu; Scott Margo

(57) ABSTRACT

An opening mechanism includes a base whereon an opening is disposed, and a covering including a main body for covering the opening. The covering further includes a hook connected to the main body for hooking the base. The covering further includes a buckling part connected to a side of the main body. The opening mechanism further includes a sliding component passing through the buckling part. An end of the sliding component is disposed on a breach of the main body. An engaging part is formed on a side of the sliding component for engaging with a fixing end. The opening mechanism further includes an elastic component installed on the side of the main body and disposed on a side of the sliding component for providing elastic force to the sliding component so as to drive the engaging part of the sliding component to engage with the fixing end.

20 Claims, 8 Drawing Sheets

OPENING MECHANISM WITH AN EASY ASSEMBLY STRUCTURE AND RELATED ELECTRONIC DEVICE

BACKGROUND OF THE INVENTION

1. Field of the Invention

The present invention relates to an opening mechanism, and more particularly, to an opening mechanism with an easy assembly structure and a related electronic device.

2. Description of the Prior Art

With the improved technology, structures of consumer electronic products become more complicated resulting in strict assembly requirement. Due to requirements of testing, a CPU door of a conventional notebook computer for covering a CPU is fixed by screws mainly. However, screwing method not only increases labor hours and labor cost, but also reduces assembly convenience. Thus, design of an opening mechanism with an easy assembly structure is an important issue in the mechanical industry.

SUMMARY OF THE INVENTION

The present invention provides an opening mechanism with an easy assembly structure for solving the above-mentioned problem.

According to the claimed invention, the opening mechanism includes a base, whereon an opening is formed. The opening mechanism further includes a covering connected to the base in a detachable manner. The covering includes a main body for covering the opening, whereon a breach is formed. The covering further includes a hook connected to the main body for hooking the base, and a buckling part connected to a side of the main body. The opening mechanism further includes a sliding component. An end of the sliding component is disposed on the breach of the main body and passes through the buckling part in a slidable manner, and an engaging part is formed on a side of the sliding component for engaging with a fixing end. The opening mechanism further includes an elastic component installed on the side of the main body and disposed on a side of the sliding component for providing elastic force to the sliding component so as to drive the engaging part of the sliding component to engage with the fixing end.

According to the claimed invention, a notch is formed on the base, and an end of the sliding component is disposed on the notch.

According to the claimed invention, the buckling part includes two lateral walls and a bottom connected to the two lateral walls. A groove is formed on the bottom, and the engaging part of the sliding component is installed inside the groove in a slidable manner.

According to the claimed invention, a positioning part is formed on the side of the sliding component, and a positioning slot is formed on the bottom for contacting against the positioning part so as to position the sliding component.

According to the claimed invention, the positioning part is a protrusion.

According to the claimed invention, the two lateral walls are integrated with the bottom monolithically.

According to the claimed invention, the two lateral walls and the bottom are formed as a U-shaped structure substantially.

According to the claimed invention, an inclined plane is formed on an end of the engaging part for contacting against the fixing end.

According to the claimed invention, the inclined plane slides relative to the fixing end so as to drive the sliding component to push the elastic component when the main body rotates relative to the base so as to reduce an angle between the main body and the base.

According to the claimed invention, the engaging part is a hook.

According to the claimed invention, a sunken part is formed on the other end of the sliding component, and the elastic component is disposed inside the sunken part.

According to the claimed invention, the elastic component is a rigid stick.

According to the claimed invention, the covering further includes a rib connected to the main body for embedding with a clamping component.

According to the claimed invention, the opening mechanism further includes a casing. The fixing end and the clamping component are disposed inside the casing.

According to the claimed invention, an electronic device includes a casing, an electronic component disposed inside the casing, and an opening mechanism for covering the electronic component. The opening mechanism includes a base installed on a side of the casing, whereon an opening is formed, and a covering connected to the base in a detachable manner. The covering includes a main body for covering the opening, whereon a breach is formed, a hook connected to the main body for hooking the base, and a buckling part connected to a side of the main body. The electronic device further includes a sliding component. An end of the sliding component is disposed on the breach of the main body and passes through the buckling part in a slidable manner, and an engaging part is formed on a side of the sliding component for engaging with a fixing end. The electronic device further includes an elastic component installed on the side of the main body and disposed on a side of the sliding component for providing elastic force to the sliding component so as to drive the engaging part of the sliding component to engage with the fixing end.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
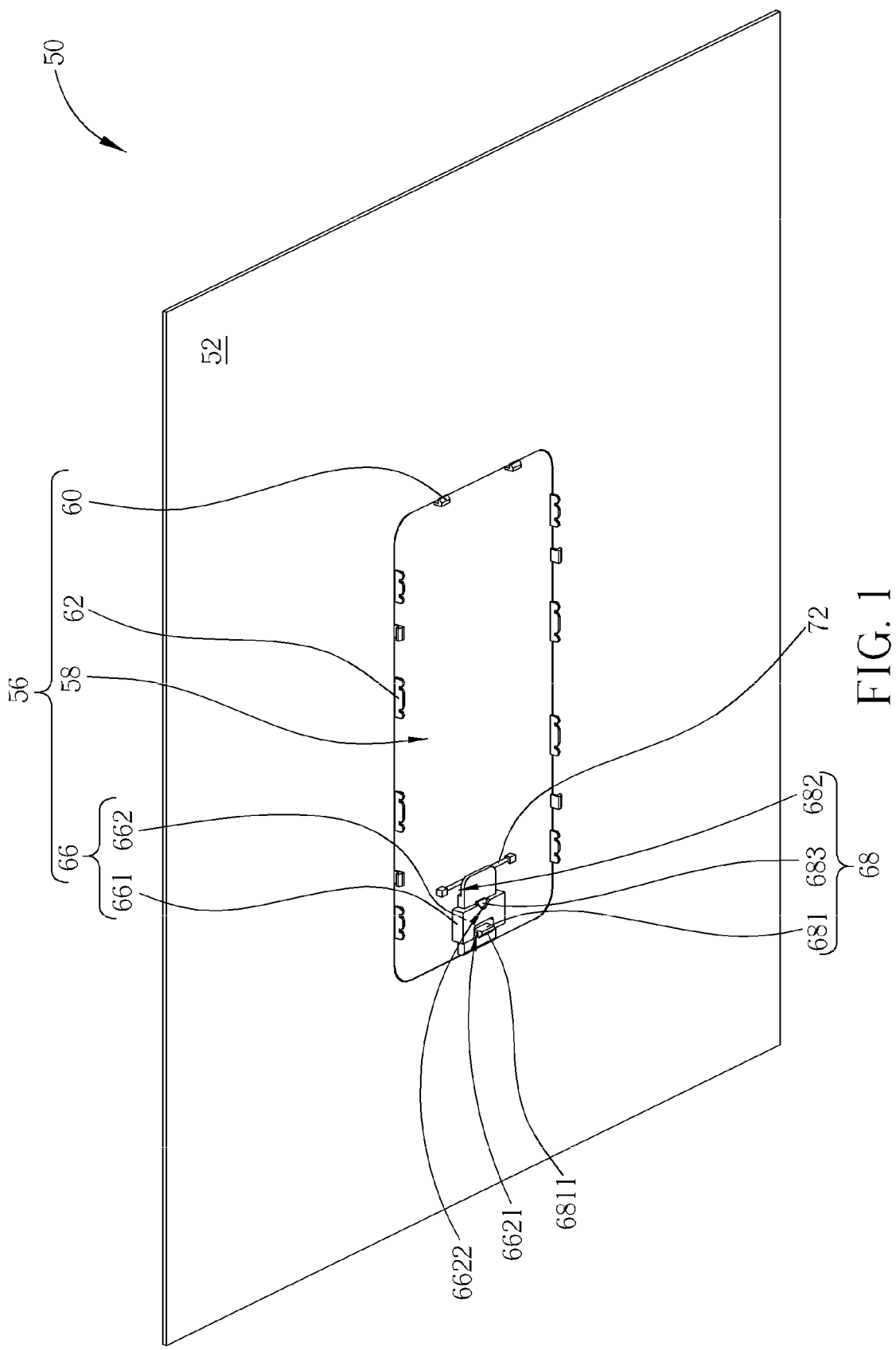
FIG. 1 is an assembly diagram of an opening mechanism of an electronic device according to a preferred embodiment of the present invention.
Figure 2:
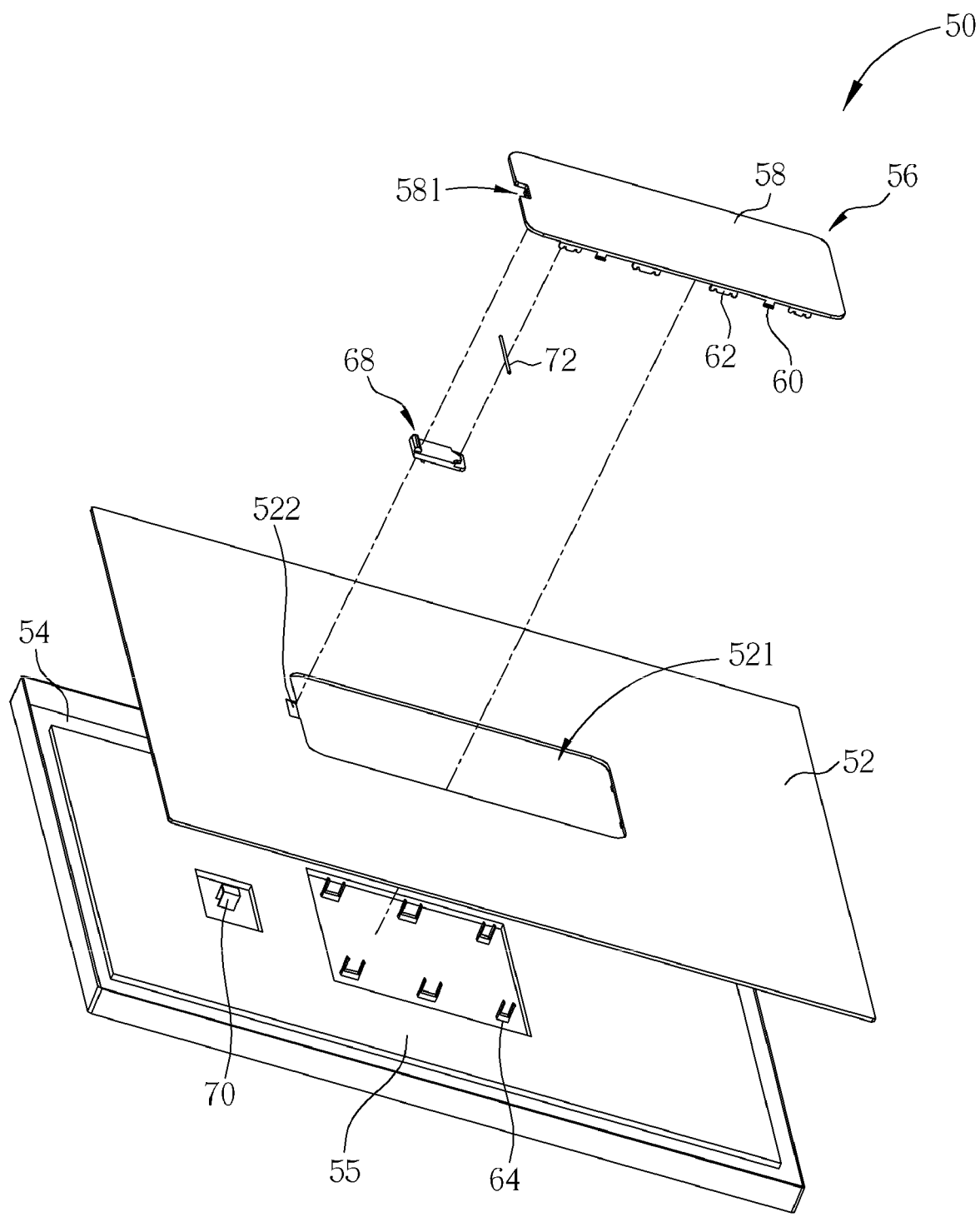
FIG. 2 and FIG. 3 are exploded diagrams of components of the opening mechanism in different views according to the preferred embodiment of the present invention.
Figure 3:
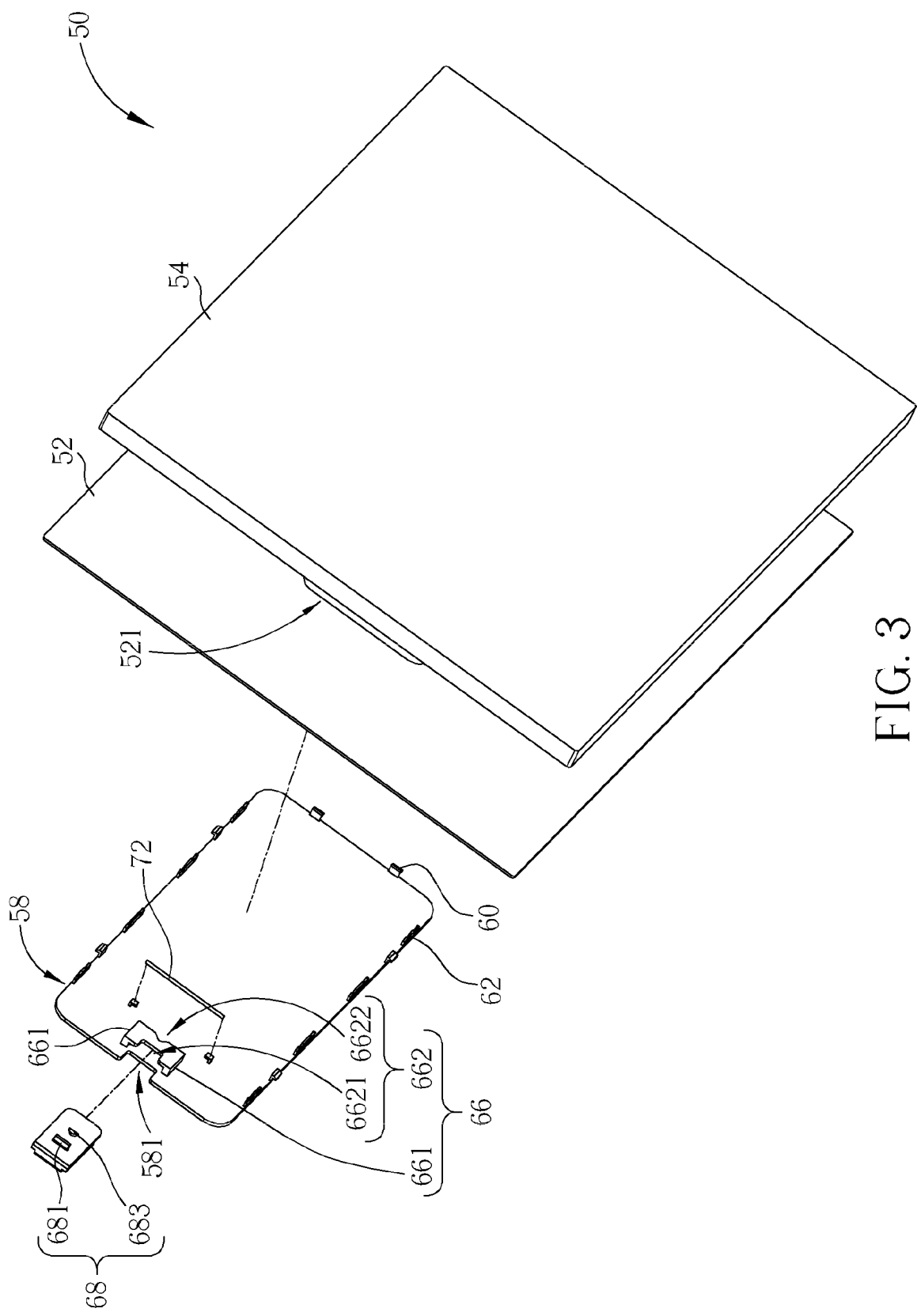

Please refer to FIG. 1, FIG. 2, and FIG. 3. FIG. 1 is an assembly diagram of an opening mechanism 50 of an electronic device according to a preferred embodiment of the present invention. FIG. 2 and FIG. 3 are exploded diagrams of components of the opening mechanism 50 in different views according to the preferred embodiment of the present invention. The electronic device can be a portable electronic device, such as a notebook computer. The opening mechanism 50 includes a base 52, whereon an opening 521 is formed. A notch 522 is disposed on a side of the opening 521. The opening mechanism 50 further includes a casing 54 disposed on a side of the base 52. A containing space is formed within the base 52 and the casing 54 for accommodating an electronic component 55, such as a circuit board, a CPU, and so on. The opening mechanism 50 further includes a covering 56 connected to the base 52 in a detachable manner so as to cover the electronic component 55 accommodated inside the base 52 and the casing 54. For example, the covering 56 can be a covering of the CPU so as to cover the CPU, which is installed inside the base 52. The covering 56 includes a main body 58 for covering the opening 521 of the base 52. A breach 581 is formed on the main body 58. The covering 56 further includes at least one hook 60 connected to the main body 58 for hooking the base 52. The covering 56 further includes at least one rib 62 connected to the main body 58. The rib 62 can be a rib structure with grooves for embedding with a corresponding clamping component 64, which can be installed inside the casing 54. The clamping component 64 can be formed as a U-shaped structure. Therefore, the hook 60 and the rib 62 can fix the covering 56 on the base 52 when the main body 58 covers the opening 521 of the base 52. Positions and numbers of the hook 60 and the rib 62 are not limited to the embodiment and depend on design demands.

In addition, the covering 56 further includes a buckling part 66 connected to a side of the main body 58. The buckling part 66 includes two lateral walls 661 and a bottom 662 connected to the two lateral walls 661. A groove 6621 and a positioning slot 6622 are formed on the bottom 662. The two lateral walls 661 and the bottom 662 can be perpendicular to each other substantially. The two lateral walls 661 and the bottom 662 can be formed as a U-shaped structure substantially. The two lateral walls 661 can be integrated with the bottom 662 monolithically. The opening mechanism 50 further includes a sliding component 68. An end of the sliding component 68 can be installed inside the breach 581 of the main body 58 and be disposed on the notch 522 of the base 52 in a slidable manner. A sunken part 682 is formed on the other end of the sliding component 68. The sliding component 68 passes through the buckling part 66. An engaging part 681 is formed on a side of the sliding component 68 for engaging with a fixing end 70, which can be disposed inside the casing 54. The engaging part 681 can be a hook. When the electronic component 55 is the circuit board, whereon a hole can be disposed, the clamping component 64 and the fixing end 70 can protrude out of the circuit board so that the clamping component 64 and the fixing end 70 can combine with the main body 58. An inclined plane 6811 is formed on an end of the engaging part 681 for contacting against the fixing end 70. Besides, the engaging part 681 can be installed inside the groove 6621 of the buckling part 66 in a slidable manner. A positioning part 683 is formed on the side of the sliding component 68. The positioning part 683 can be a protrusion. The positioning slot 6622 of the bottom 662 is for contacting against the positioning part 683 so as to position the sliding component 68. The opening mechanism 50 further includes an elastic component 72 installed on the side of the main body 58 and disposed inside the sunken part 682 of the sliding component 68 for providing elastic force to the sliding component 68 so that the engaging part 681 of the sliding component 68 can engage with the fixing end 70. The elastic component 72 can be a rigid stick or an elastic clip.

Figure 4:
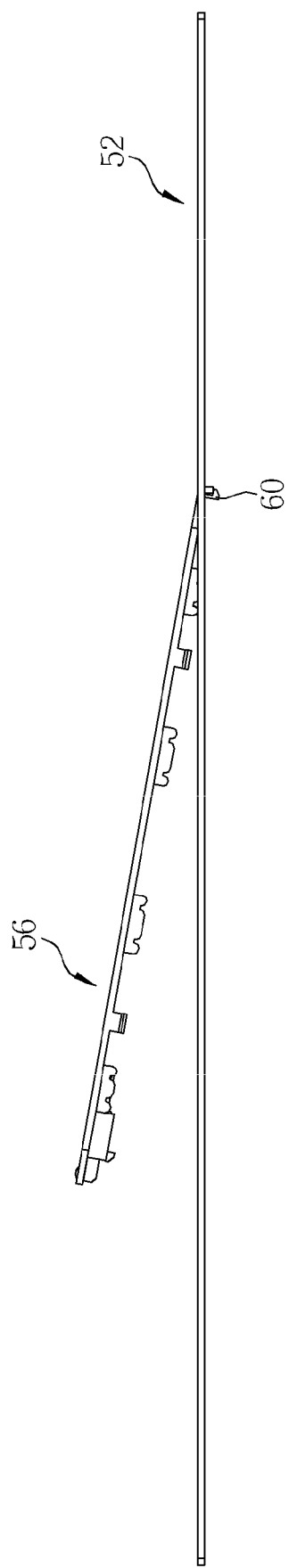
FIG. 4 is a lateral view of a covering installed on a base according to the preferred embodiment of the present invention.
Figure 5:
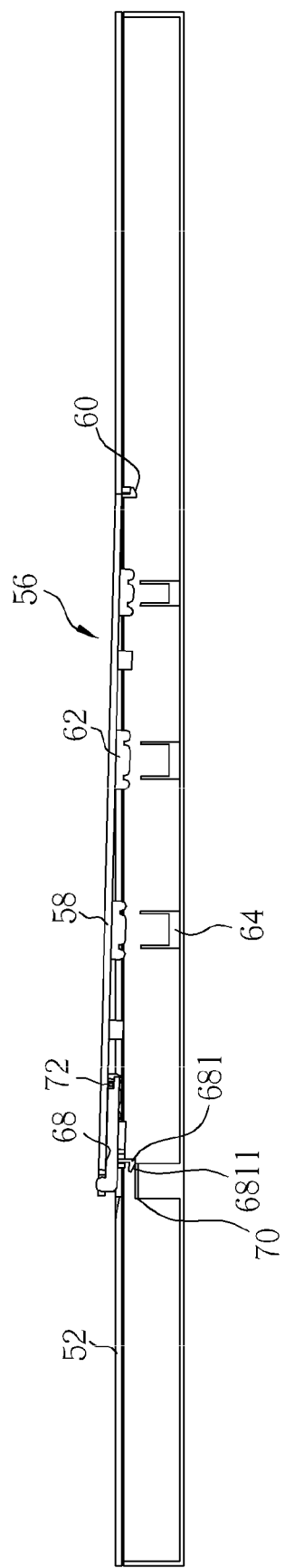
FIG. 5 and FIG. 6 are sectional views of an engaging part of a sliding component and a fixing end in different positions according to the preferred embodiment of the present invention.
Figure 6:
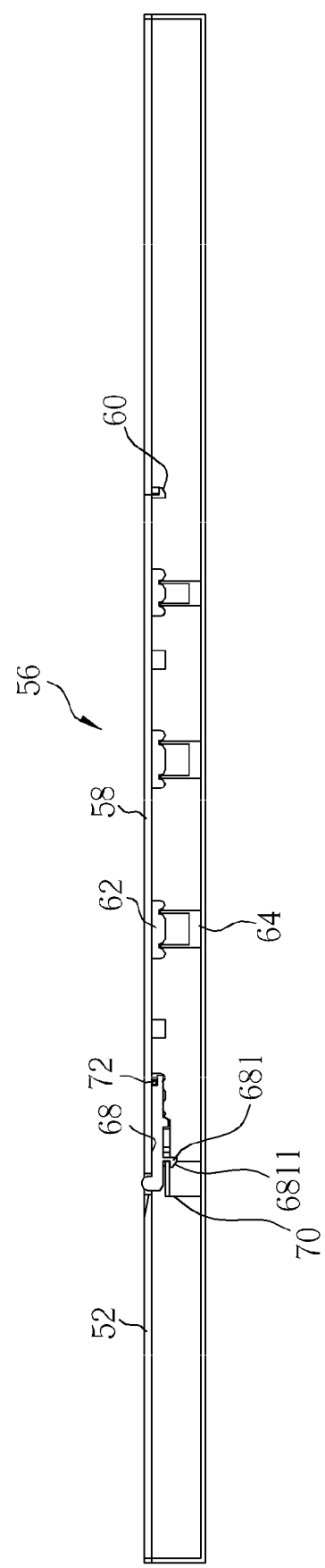
Figure 7:
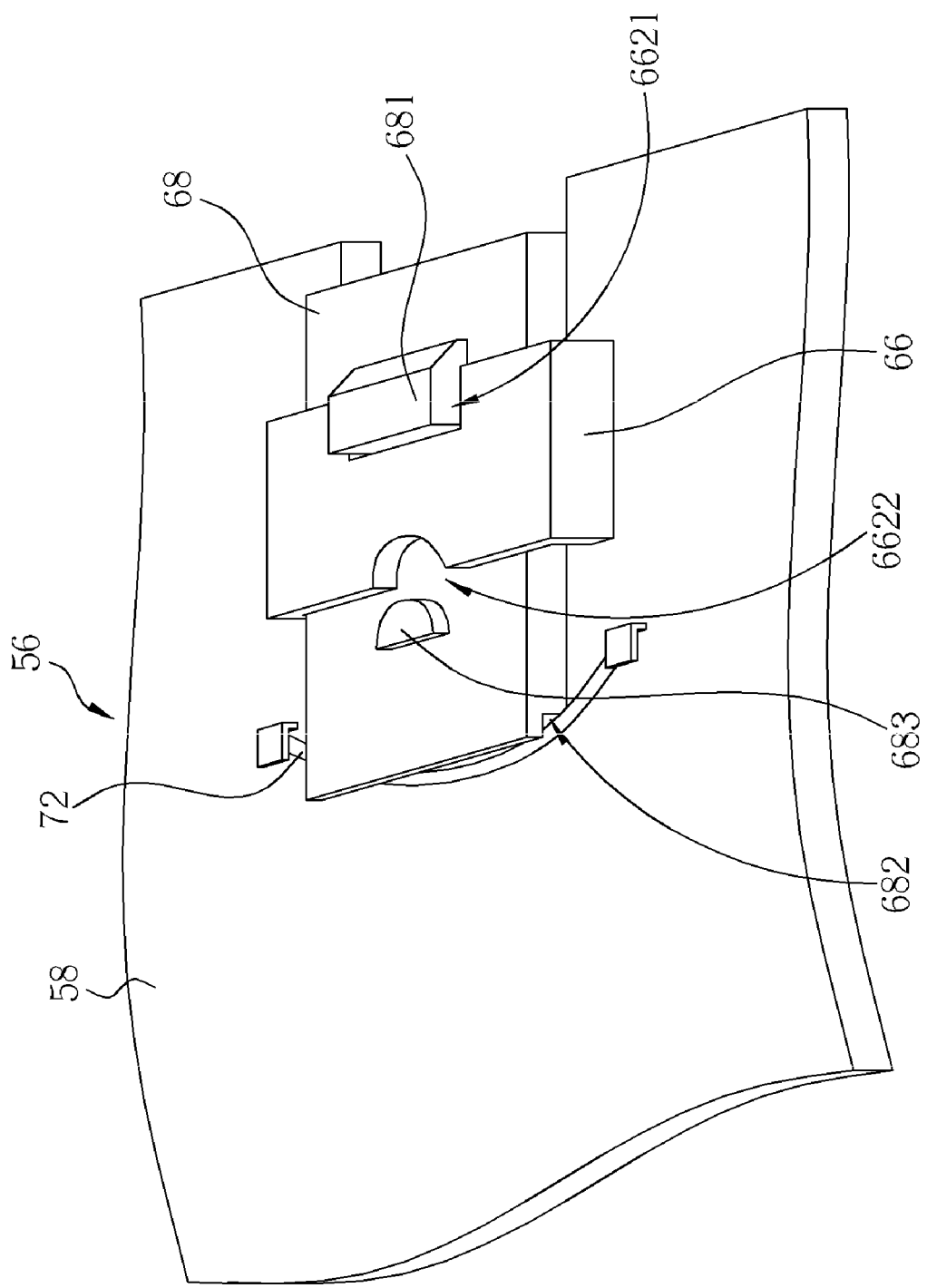
FIG. 7 and FIG. 8 are diagrams illustrating relative positions of the sliding component and an elastic component in different states of the opening mechanism according to the preferred embodiment of the present invention.
Figure 8:
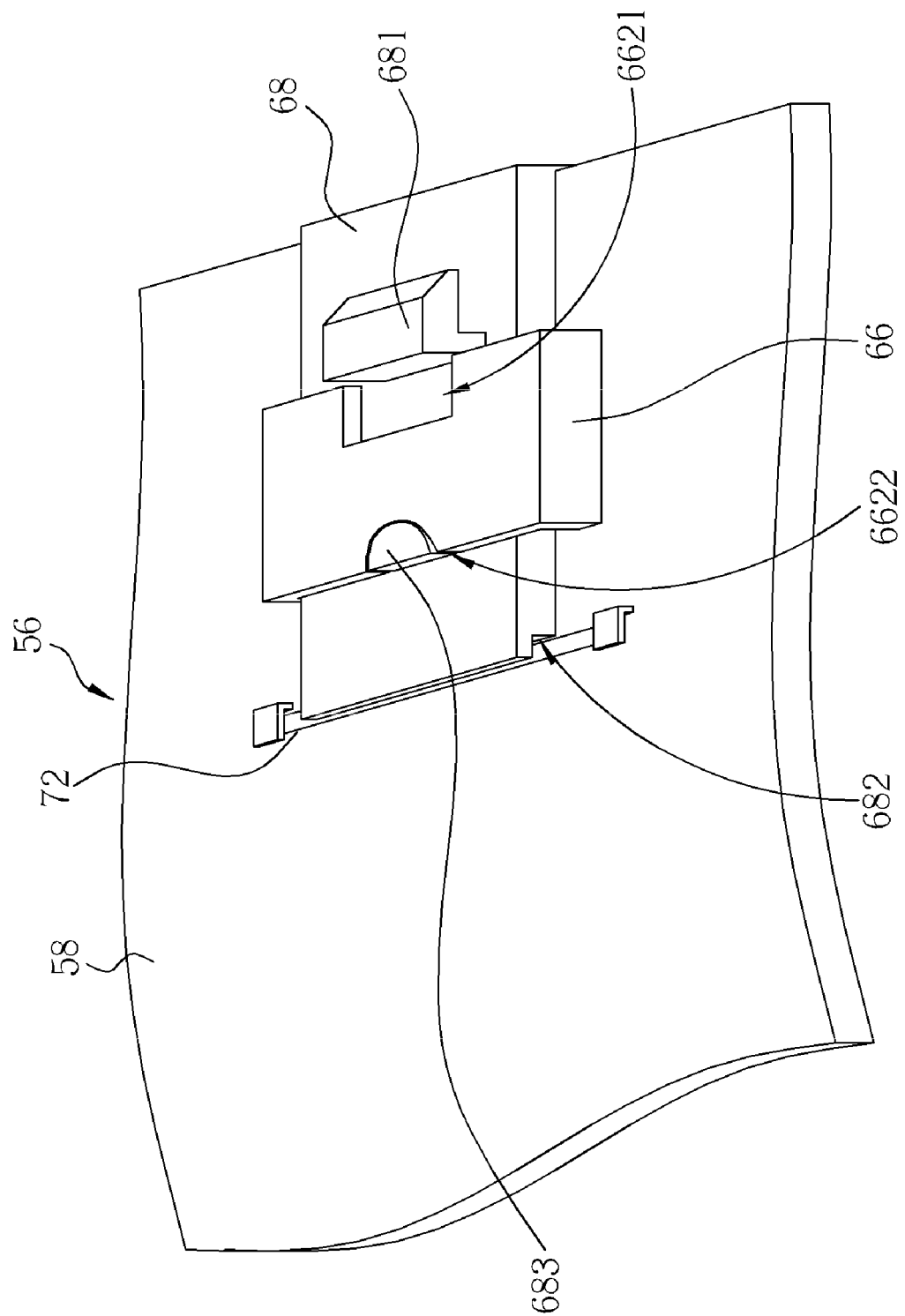

Please refer to FIG. 4 to FIG. 8. FIG. 4 is a lateral view of the covering 56 installed on the base 52 according to the preferred embodiment of the present invention. FIG. 5 and FIG. 6 are sectional views of the engaging part 681 of the sliding component 68 and the fixing end 70 in different relative positions according to the preferred embodiment of the present invention. FIG. 7 and FIG. 8 are diagrams illustrating relative positions of the sliding component 68 and the elastic component 72 in different states of the opening mechanism 50 according to the preferred embodiment of the present invention. As shown in FIG. 4, the covering 56 can be inserted into a side of the opening 521 of the base 52 awry, and the hook 60 of the covering 56 can be engaged with the base 52. Then, the covering 56 can be pressed down for rotating the main body 58 relative to the base 52 so as to reduce an angle between the main body 58 and the base 52. Meanwhile, as shown in FIG. 5, the inclined plane 6811 of the engaging part 681 contacts against the fixing end 70 and slides downwardly relative to the fixing end 70. The sliding component 68 moves toward the elastic component 72 due to relative motion between the inclined plane 6811 of the engaging part 681 and the fixing end 70. As shown in FIG. 7, the sliding component 68 pushes the elastic component 72 at this time. Because two ends of the elastic component 72 are fixed, larger elastic deformation is generated at central part of the elastic component 72. When the inclined plane 6811 of the engaging part 681 slides downwardly, which is relative to the fixing end 70, to a position, where the inclined plane 6811 departs from the fixing end 70, the inclined plane 6811 of the engaging part 681 does not contact against the fixing end 70. At the same time, the elastic component 72 applies elastic restoring force on the sliding component 68, so that the sliding component 68 is recovered from a position as shown in FIG. 7 to a position as shown in FIG. 8. Meantime, the positioning part 683 of the sliding component 68 slides into the positioning slot 6622 so as to position the sliding component 68. Because the engaging part 681 is pushed away from the elastic component 72, the engaging part 681 can engage with the fixing end 70. Therefore, the covering 56 can be fixed on the base 52, and the rib 62 is embedded with the corresponding clamping component 64, so that the covering 56 can be fixed on the base 52 more stably. On the other hand, when a user wants to disassemble the covering 56 form the base 52, an end of the sliding component 68, which protrudes out of the breach 581 of the main body 58, can be pushed toward the elastic component 72 and the covering 56 can be lifted outwardly. Then, the inclined plane 6811 of the engaging part 681 slides upwardly, which is relative to the fixing end 70, to the position, where the inclined plane 6811 departs from the fixing end 70, so that the covering 56 can be disassembled easily.

Comparing to the prior art, the opening mechanism of the present invention can be fixed without screws. Therefore, the present invention not only can reduce labor cost and labor hours, but also improves assembly convenience.

Those skilled in the art will readily observe that numerous modifications and alterations of the device and method may be made while retaining the teachings of the invention.

What is claimed is:

1. An opening mechanism comprising:
a base, whereon an opening is formed;
a covering connected to the base in a detachable manner, the covering comprising:
   a main body for covering the opening, whereon a breach is formed;
   a hook connected to the main body for hooking the base; and
   a buckling part connected to a side of the main body, the buckling part comprising two lateral walls and a bottom connected to the two lateral walls, and a groove and a positioning slot being formed on the bottom;
a sliding component, an end of the sliding component being disposed on the breach of the main body and passing through the buckling part in a slidable manner, an engaging part being formed on a first side of the sliding component for engaging with a fixing end and being installed inside the groove in a slidable manner, a positioning part being formed on the side of the sliding component, and the positioning slot being for contacting against the positioning part so as to position the sliding component; and
an elastic component installed on the side of the main body and disposed on a second side of the sliding component for providing elastic force to the sliding component so as to drive the engaging part of the sliding component to engage with the fixing end.

2. The opening mechanism of claim 1, wherein a notch is formed on the base, and an end of the sliding component is disposed on the notch.

3. The opening mechanism of claim 1, wherein the two lateral walls and the bottom are formed as a U-shaped structure substantially.

4. The opening mechanism of claim 1, wherein an inclined plane is formed on an end of the engaging part for contacting against the fixing end.

5. The opening mechanism of claim 4, wherein the inclined plane slides relative to the fixing end so as to drive the sliding component to push the elastic component when the main body rotates relative to the base so as to reduce an angle between the main body and the base.

6. The opening mechanism of claim 1, wherein a sunken part is formed on the other end of the sliding component, and the elastic component is disposed inside the sunken part.

7. The opening mechanism of claim 1, wherein a clamping component is disposed on a side of the base, and the covering further comprises a rib connected to the main body for embedding with the clamping component.

8. The opening mechanism of claim 7, further comprising:
a casing, the fixing end and the clamping component being disposed inside the casing.

9. An electronic device comprising:
a casing;
an electronic component disposed inside the casing; and
an opening mechanism for covering the electronic component, the opening mechanism comprising:
   a base installed on a side of the casing, whereon an opening is formed;
   a covering connected to the base in a detachable manner, the covering comprising:
      a main body for covering the opening, whereon a breach is formed;
      a hook connected to the main body for hooking the base; and
      a buckling part connected to a side of the main body, the buckling part comprising two lateral walls and a bottom connected to the two lateral walls, and a groove and a positioning slot being formed on the bottom;
   a sliding component, an end of the sliding component being disposed on the breach of the main body and passing through the buckling part in a slidable manner, an engaging part being formed on a first side of the sliding component for engaging with a fixing end and being installed inside the groove in a slidable manner, a positioning part being formed on the side of the sliding component, and the positioning slot being for contacting against the positioning part so as to position the sliding component; and
   an elastic component installed on the side of the main body and disposed on a second side of the sliding component for providing elastic force to the sliding component so as to drive the engaging part of the sliding component to engage with the fixing end.

10. The electronic device of claim 9, wherein a notch is formed on the base, and an end of the sliding component is disposed on the notch.

11. The electronic device of claim 9, wherein the two lateral walls and the bottom are formed as a U-shaped structure substantially.

12. The electronic device of claim 9, wherein an inclined plane is formed on an end of the engaging part for contacting against the fixing end.

13. The electronic device of claim 12, wherein the inclined plane slides relative to the fixing end so as to drive the sliding component to push the elastic component when the main body rotates relative to the base so as to reduce an angle between the main body and the base.

14. The electronic device of claim 9, wherein a sunken part is formed on the other end of the sliding component, and the elastic component is disposed inside the sunken part.

15. The electronic device of claim 9, wherein a clamping component is disposed inside the casing, and the covering further comprises a rib connected to the main body for embedding with the clamping component.

16. The electronic device of claim 9, wherein the fixing end is disposed inside the casing.

17. An opening mechanism comprising:
a base, whereon an opening is formed;
a covering connected to the base in a detachable manner, the covering comprising:
   a main body for covering the opening, whereon a breach is formed;
   a hook connected to the main body for hooking the base; and
   a buckling part connected to a side of the main body;
a sliding component, an end of the sliding component being disposed on the breach of the main body and passing through the buckling part in a slidable manner, an engaging part being formed on a first side of the sliding component for engaging with a fixing end, and an inclined plane being formed on an end of the engaging part for contacting against the fixing end; and
an elastic component installed on the side of the main body and disposed on a second side of the sliding component for providing elastic force to the sliding component so as to drive the engaging part of the sliding component to engage with the fixing end.

18. The opening mechanism of claim 17, wherein the buckling part comprises two lateral walls and a bottom connected to the two lateral walls, a groove is formed on the bottom, and the engaging part of the sliding component is installed inside the groove in a slidable manner.

19. The opening mechanism of claim 18, wherein a positioning part is formed on the side of the sliding component, and a positioning slot is formed on the bottom for contacting against the positioning part so as to position the sliding component.

20. The opening mechanism of claim 17, wherein the inclined plane slides relative to the fixing end so to drive the sliding component to push the elastic component when the main body rotates relative to the base so as to reduce an angle between the main body and the base.

* * * * *